(12) United States Patent
Yasui et al.

(10) Patent No.: US 11,199,781 B2
(45) Date of Patent: Dec. 14, 2021

(54) WRITING DATA GENERATING METHOD, MULTI CHARGED PARTICLE BEAM WRITING APPARATUS, PATTERN INSPECTING APPARATUS, AND COMPUTER-READABLE RECORDING MEDIUM

(71) Applicant: NuFlare Technology, Inc., Yokohama (JP)

(72) Inventors: Kenichi Yasui, Yokohama (JP); Noriaki Nakayamada, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 7 days.

(21) Appl. No.: 16/646,860

(22) PCT Filed: Aug. 3, 2018

(86) PCT No.: PCT/JP2018/029211
§ 371 (c)(1),
(2) Date: Mar. 12, 2020

(87) PCT Pub. No.: WO2018/058782
PCT Pub. Date: Mar. 28, 2019

(65) Prior Publication Data
US 2020/0278612 A1    Sep. 3, 2020

(30) Foreign Application Priority Data

Sep. 20, 2017  (JP) .............................. JP2017-180067

(51) Int. Cl.
*G03F 7/20* (2006.01)
*H01J 37/30* (2006.01)
(Continued)

(52) U.S. Cl.
CPC .......... *G03F 7/705* (2013.01); *G03F 7/70025* (2013.01); *G03F 7/70525* (2013.01);
(Continued)

(58) Field of Classification Search
CPC .. G03F 7/705; G03F 7/70025; G03F 7/70525; G03F 7/20; H01J 37/3005;
(Continued)

(56) References Cited

U.S. PATENT DOCUMENTS 5,581,673 A * 12/1996 Kikuchi ................. G06T 17/20
345/423
5,666,472 A    9/1997 Huddy
(Continued)

FOREIGN PATENT DOCUMENTS

JP    4-184392 A    7/1992
JP    5-175107 A    7/1993
(Continued)

OTHER PUBLICATIONS

International Search Report dated Oct. 16, 2018 in PCT/JP2018/029211 filed Aug. 3, 2018, 1 page.
Taiwanese Office Action dated Jul. 18, 2019 in Taiwanese Patent Application No. 107128418 filed Sep. 20, 2017 (with English translation), 11 pages.
(Continued)

*Primary Examiner* — David E Smith
(74) *Attorney, Agent, or Firm* — Oblon, McClelland, Maier & Neustadt, L.L.P.

(57) ABSTRACT

A writing data generating method for generating writing data used in a multi charged particle beam writing apparatus, that can suppress a data amount and a calculation amount in a multi charged particle beam writing apparatus generated from design data including a figure having a curve. The method includes calculating a pair of curves each representing a curve portion of a figure included in design data, the curves each being defined by a plurality of control points, and generating the writing data by expressing a position of (Continued)

a second control point adjacent in a traveling direction of the curve to a first control point of the plurality of control points as a displacement from the first control point in the traveling direction of the curve and a displacement from the first control point in a direction orthogonal to the traveling direction.

10 Claims, 6 Drawing Sheets

(51) Int. Cl.
    *H01J 37/317*     (2006.01)
    *H01J 37/305*     (2006.01)
    *H01J 37/302*     (2006.01)
(52) U.S. Cl.
    CPC ........ *H01J 37/3005* (2013.01); *H01J 37/305* (2013.01); *H01J 37/3023* (2013.01); *H01J 37/3177* (2013.01); *H01J 2237/3174* (2013.01)
(58) Field of Classification Search
    CPC .. H01J 37/3023; H01J 37/305; H01J 37/3174; H01J 37/3177
    See application file for complete search history.

(56) References Cited

U.S. PATENT DOCUMENTS

| | | | |
|---|---|---|---|
| 5,689,627 A * | 11/1997 | Arai | ........................ G06T 11/40 |
| | | | 345/423 |
| 5,717,847 A | 2/1998 | Schulmeiss | |
| 6,774,375 B2 | 8/2004 | Plontke et al. | |
| 9,558,315 B2 * | 1/2017 | Yasui | ................... H01J 37/3026 |
| 2001/0040221 A1 * | 11/2001 | Plontke | .................. B82Y 40/00 |
| | | | 250/492.1 |
| 2009/0194710 A1 | 8/2009 | Shibata | |
| 2016/0103945 A1 | 4/2016 | Yasui et al. | |

FOREIGN PATENT DOCUMENTS

| | | |
|---|---|---|
| JP | 5-267132 A | 10/1993 |
| JP | 6-215152 A | 8/1994 |
| JP | 8-504984 A | 5/1996 |
| JP | 2001-290281 A | 10/2001 |
| JP | 2009-188000 A | 8/2009 |
| JP | 2016-76654 A | 5/2016 |

OTHER PUBLICATIONS

Japanese Office Action dated May 26, 2020 in Patent Application No. 2017-180067 (with English translation), 6 pages.

* cited by examiner

| Header | Code |
| --- | --- |
| | N |
| | Curve Information |
| Body | x0 |
| | y0 |
| | L0 |
| | L1 |
| | $\delta_{11}$ |
| | $\delta_{12}$ |
| | L2 |
| | $\delta_{21}$ |
| | $\delta_{22}$ |
| | ⋮ |
| | LN |
| | $\delta_{N1}$ |
| | $\delta_{N2}$ |

| flag2 flag3 | Meaning |
|---|---|
| 0 0 | Right Angle of Type I |
| 0 1 | Right Angle of Type II |
| 1 0 | Straight Line (Arbitrary Angle) |
| 1 1 | Curve |

| flag1 | Meaning |
|---|---|
| 0 0 | Flat Portion |
| 0 1 | Only Lower Side Portion |
| 1 0 | Only Upper Side Portion |
| 1 1 | Both Side Portions |

WRITING DATA GENERATING METHOD, MULTI CHARGED PARTICLE BEAM WRITING APPARATUS, PATTERN INSPECTING APPARATUS, AND COMPUTER-READABLE RECORDING MEDIUM

TECHNICAL FIELD

The present invention relates to a writing data generating method, a multi charged particle beam writing apparatus, a pattern inspecting apparatus, and a computer-readable recording medium.

BACKGROUND ART

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

As an electron beam writing apparatus, for example, a multi-beam writing apparatus is known, which uses multiple beams to irradiate with many beams at a time and provides improved throughput. In the multi-beam writing apparatus, for example, an electron beam emitted from an electron gun passes through an aperture member with a plurality of holes to form multiple beams, and each beam is blanking-controlled by a blanking plate. Beams that have not been blocked are reduced in size by an optical system and projected onto a mask (writing target) at desired positions.

To perform electron beam writing using the multi-beam writing apparatus, the layout of a semiconductor integrated circuit is designed first to generate design data as layout data. By dividing a polygonal figure contained in the design data into a plurality of trapezoids, writing data input to the multi-beam writing apparatus is generated. The writing data includes, for each of the trapezoids, coordinate data of a placement origin, which is one vertex of the trapezoid, and data representing a displacement from the placement origin to each of the other three vertices.

When the design data includes a figure with curves, such as an elliptical figure, or a figure with both curves and straight lines, the figure is approximated to a polygon to generate writing data. When high-precision approximation is performed, the resulting increase in the number of vertices or figures leads to a larger amount of writing data.

PTL 1: JP-2009-188000A
PTL 2: JP-H6-215152A
PTL 3: JP-H5-175107A
PTL 4: JP-H5-267132A
PTL 5: JP-H4-184392A

SUMMARY OF INVENTION

An object of the present invention is to provide a writing data generating method for generating, a multi charged particle beam writing apparatus, and a computer-readable recording medium which generate writing data capable of suppressing a data amount and a calculation amount in a multi charged particle beam writing apparatus from design data including a figure having a curve. Also, an object of the present invention is to provide a pattern inspecting apparatus which can generate writing data with a reduced data amount and improve processing efficiency.

According to one aspect of the present invention, a writing data generating method is for generating writing data used in a multi charged particle beam writing apparatus. The method includes calculating a pair of curves each representing a curve portion of a figure included in design data, the curves each being defined by a plurality of control points, and generating the writing data by expressing a position of a second control point adjacent in a traveling direction of the curve to a first control point of the plurality of control points as a displacement from the first control point in the traveling direction of the curve and a displacement from the first control point in a direction orthogonal to the traveling direction.

ADVANTAGEOUS EFFECTS OF INVENTION

According to the present invention, writing data capable of suppressing a data amount and a calculation amount in a multi charged particle beam writing apparatus can be generated from design data.

DESCRIPTION OF EMBODIMENTS

An embodiment of the present invention will be described below on the basis of the drawings.

Figure 1:
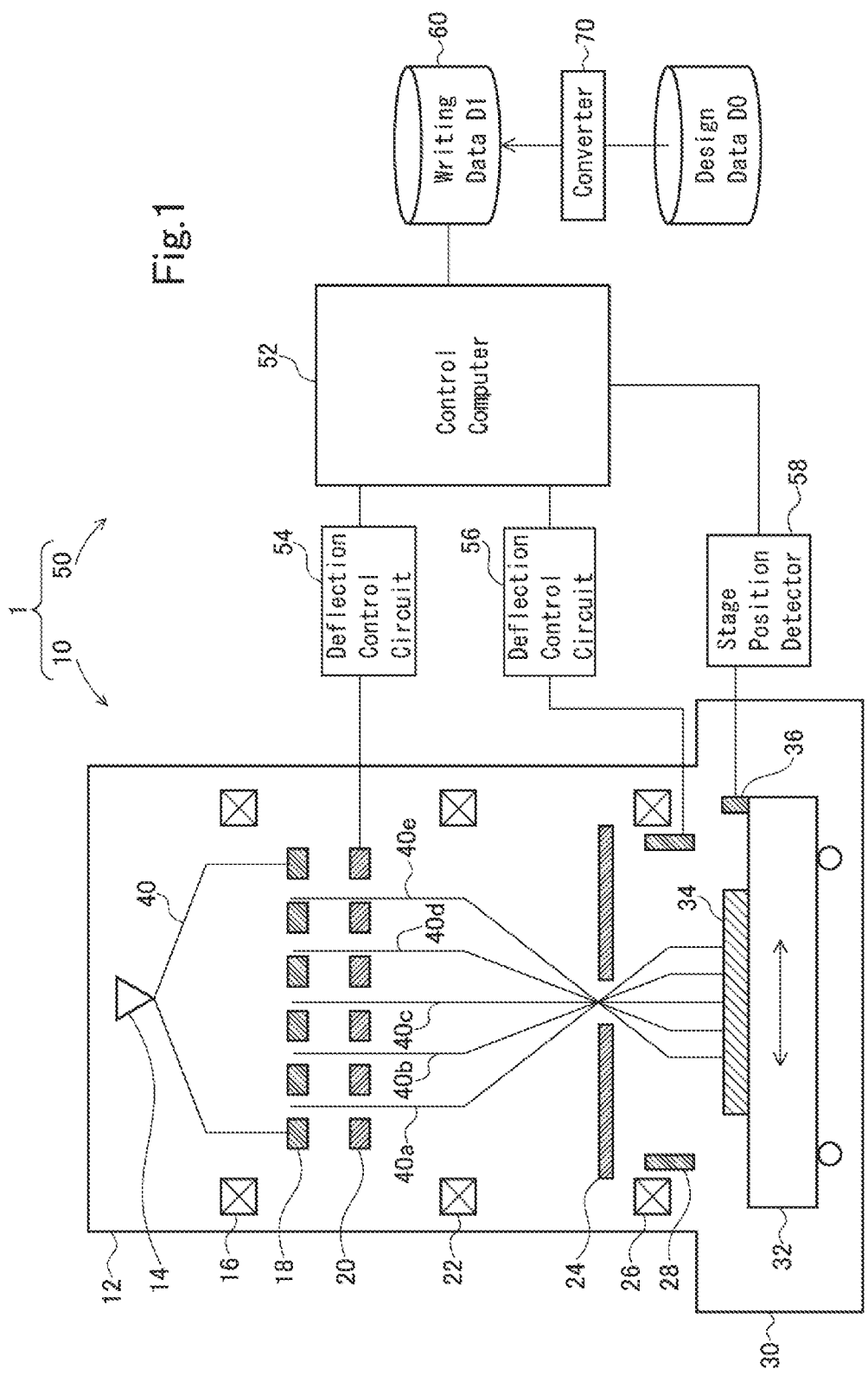
FIG. 1 is a schematic diagram of a multi charged particle beam writing apparatus according to an embodiment of the present invention.

FIG. 1 is a schematic diagram of a multi charged particle beam writing apparatus that performs writing using writing data, according to the present embodiment. The present embodiment describes a configuration that uses electron beams as an example of charged particle beams. The charged particle beams are not limited to electron beams and may be other charged particle beams, such as ion beams.

A writing apparatus 1 illustrated in FIG. 1 includes a writer 10 configured to irradiate a target object, such as a mask or wafer, with electron beams to write a desired pattern thereon, and a controller 50 configured to control the writing operation of the writer 10. The writer 10 includes an electron beam column 12 and a writing chamber 30.

The electron beam column 12 includes an electron gun 14, an illuminating lens 16, an aperture member 18, a blanking plate 20, a reducing lens 22, a limiting aperture member 24, an objective lens 26, and a deflector 28 which are disposed therein. The writing chamber 30 includes an XY stage 32 disposed therein. A mask blank 34, which is a writing target substrate, is placed on the XY stage 32. Examples of the target object include a wafer and an exposure mask used to transfer a pattern onto a wafer using a step-and-repeat exposure system or extreme ultraviolet exposure system (e.g., stepper or scanner) in which an excimer laser serves as a light source. Examples of the writing target substrate also include a mask having a pattern already formed thereon. For example, for a Levenson mask which requires two writing passes, a mask with a pattern written thereon in the first pass may be subjected to the second pattern writing. A mirror 36 used to measure the position of the XY stage 32 is also disposed on the XY stage 32.

The controller 50 includes a control computer 52, deflection control circuits 54 and 56, and a stage position detector 58. The control computer 52, the deflection control circuits 54 and 56, and the stage position detector 58 are connected to each other via a bus.

An electron beam 40 emitted from the electron gun 14 substantially perpendicularly illuminates the entire aperture member 18 through the illuminating lens 16. The aperture member 18 has holes (openings) arranged in a matrix at a predetermined array pitch. The electron beam 40 illuminates a region including all the holes in the aperture member 18. Allowing part of the electron beam 40 to pass through each of the plurality of holes produces multiple beams 40a to 40e illustrated in FIG. 1.

The blanking plate 20 has through holes which are formed therein to coincide with the respective positions of the holes in the aperture member 18, and each of the through holes is provided with a blanker composed of two electrodes in a pair. The electron beams 40a to 40e passing through the respective through holes are each independently deflected by a voltage applied thereto by the corresponding blanker, and thus blanking-controlled by the deflection. The plurality of blankers thus each perform blanking deflection of a corresponding one of the multiple beams passed through the plurality holes in the aperture member 18.

After passing through the blanking plate 20, the multiple beams 40a to 40e are reduced in size by the reducing lens 22 and travel toward a central hole formed in the limiting aperture member 24. Electron beams deflected by the blankers of the blanking plate 20 deviate from the central hole in the limiting aperture member 24 and are blocked by the limiting aperture member 24. On the other hand, electron beams not deflected by the blankers of the blanking plate 20 pass through the central hole in the limiting aperture member 24.

The limiting aperture member 24 is thus configured to block the beams deflected by the blankers of the blanking plate 20 to be turned off. The beams passed through the limiting aperture member 24 after being turned on before being turned off are beams that form a single shot. The multiple beams 40a to 40e passed through the limiting aperture member 24 are focused by the objective lens 26 to form a pattern image with a desired reduction ratio. The beams (or all multiple beams) passed through the limiting aperture member 24 are deflected together by the deflector 28 in the same direction, and projected onto the mask blank 34 at their respective beam irradiation positions.

During continuous movement of the XY stage 32, the beam irradiation positions are controlled by the deflector 28 to follow the movement of the XY stage 32. The XY stage 32 is moved by a stage control unit (not shown), and the position of the XY stage 32 is detected by the stage position detector 58.

Multiple beams used to irradiate at a time are ideally arranged at a pitch obtained by multiplying the array pitch of the plurality of holes in the aperture member 18 by the desired reduction ratio described above. This writing apparatus performs a writing operation using a raster scanning technique which involves continuous and sequential shot beam irradiation. By blanking control, beams that are required to write a desired pattern are appropriately controlled to be turned on.

The control computer 52 reads writing data D1 from a storage device 60, and performs multiple stages of data conversion to generate shot data specific to the apparatus. In the shot data, the amount of irradiation and the coordinates of the irradiation position of each shot are defined. For example, the control computer 52 assigns a graphic pattern defined in the writing data to corresponding pixels. Then, for each pixel, the control computer 52 calculates the area density of the graphic pattern to be placed.

The control computer 52 calculates, for each pixel, the amount of irradiation of electron beams per shot. For example, the control computer 52 determines the amount of irradiation proportional to the area density of the pixel, and corrects the amount of irradiation by taking into account dimensional variation caused, for example, by a proximity effect, a fogging effect, or a loading effect.

The control computer 52 outputs the amount of irradiation of each shot to the deflection control circuit 54 on the basis of shot data. The deflection control circuit 54 divides the input amount of irradiation by a current density to determine an irradiation time t. To perform the corresponding shot, the deflection control circuit 54 applies a deflection voltage to the corresponding blankers of the blanking plate 20 in such a manner that the blankers keep beams on during the irradiation time t.

At the same time, the control computer 52 outputs deflection position data to the deflection control circuit 56 such that each beam is deflected to a position (coordinates) indicated by the shot data. The deflection control circuit 56 computes the amount of deflection and applies a deflection voltage to the deflector 28. Multiple beams to be shot at a time are thus deflected together.

A method for generating the writing data D1 will now be described. First, the layout of a semiconductor integrated circuit is designed, and design data (CAD data) D0 serving as layout data is generated. The design data D0 is converted by a converter 70 into the writing data D1 that is to be input to the control computer 52 of the writing apparatus 1.

The design data D0 includes a figure with curves. The converter 70 determines positional information of a plurality of control points and curve type information for representing the curves (parametric curve representation), and generates the writing data D1 including the information determined.

Figure 2:
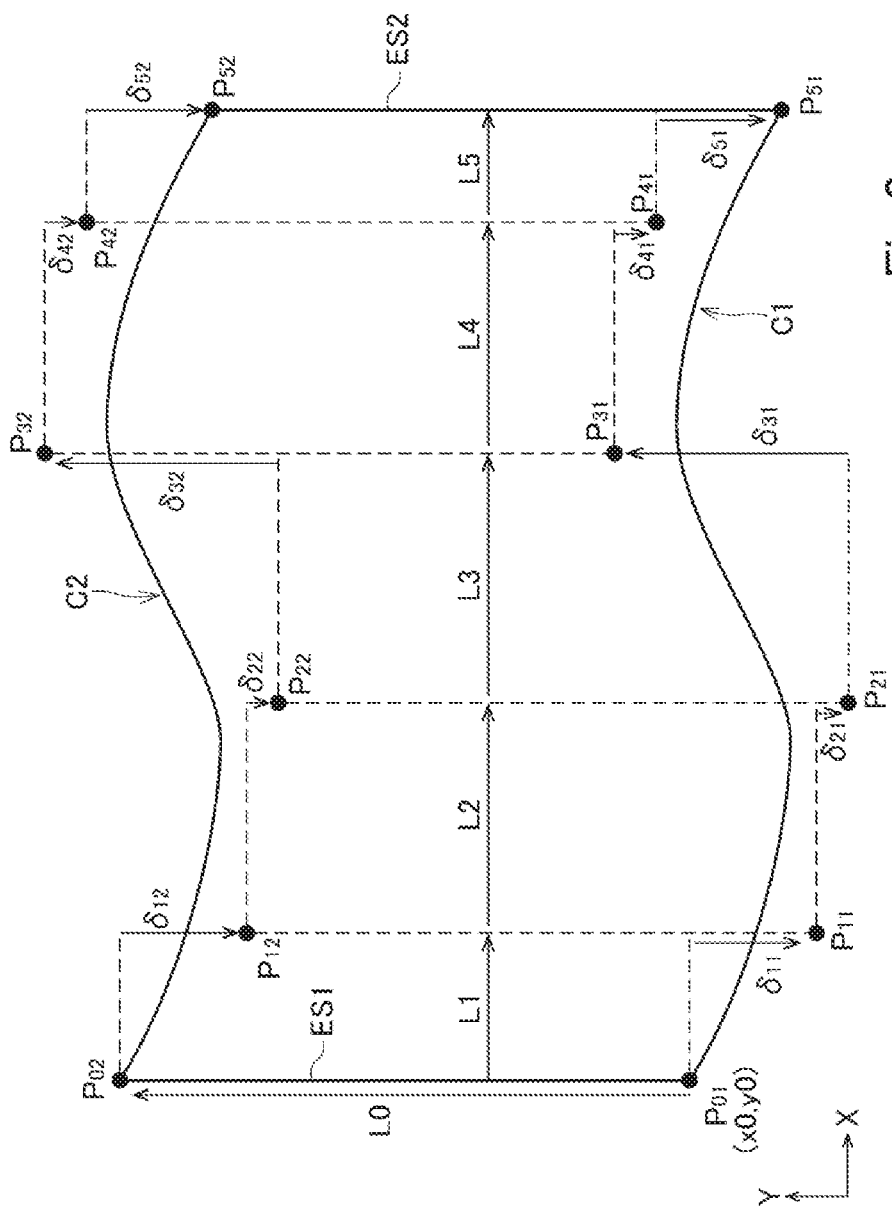
FIG. 2 is a diagram illustrating an exemplary representation of a curve.

FIG. 2 illustrates an exemplary figure with curves. This figure is surrounded by a set of parallel linear end sides ES1 and ES2 extending along a first direction (Y-direction) and a set of curves C1 and C2 extending in a second direction (X-direction) orthogonal to the first direction.

The curve C1 is a lower side portion coupled to the lower ends of the end sides ES1 and ES2, and the curve C2 is an upper side portion coupled to the upper ends of the end sides ES1 and ES2. The pair of curves C1 and C2 does not bend 90° or more from the traveling direction (+X-direction in FIG. 2). The curves C1 and C2 do not cross each other.

In the example illustrated in FIG. 2, the curve C1 is represented (or approximated) by a B-spline curve defined by six control points $P_{01}$, $P_{11}$, $P_{21}$, $P_{31}$, $P_{41}$, and $P_{51}$. The curve C2 is represented (or approximated) by a B-spline curve defined by six control points $P_{02}$, $P_{12}$, $P_{22}$, $P_{32}$, $P_{42}$, and $P_{52}$. The control point $P_{11}$ and the control point $P_{12}$ have the same horizontal position (or X-coordinate). Similarly, the control points $P_{21}$, $P_{31}$, and $P_{41}$ have the same horizontal positions (or X-coordinates) as the control points $P_{22}$, $P_{32}$, and $P_{42}$, respectively.

After determining the type of, and control points for, a curve representing a curve portion of the figure, the converter 70 expresses the position of each control point as a displacement from the adjacent control point to generate the writing data D1. For example, in the example illustrated in FIG. 2, the coordinates (x0, y0) of the vertex (control point) $P_{01}$ at the lower end of the end side ES1 are defined as the figure placement origin of this figure.

Of the control points for the curve C1, the control point $P_{11}$ follows (or is next to) the control point $P_{01}$. The position of the control point $P_{11}$ is defined by a displacement L1 in the curve's traveling direction (horizontal direction) and a displacement $\delta_{11}$ in the vertical direction, as viewed from the control point Poi.

The position of the control point $P_{21}$ following the control point $P_{11}$ is defined by a displacement L2 in the horizontal direction and a displacement $\delta_{21}$ in the vertical direction, as viewed from the control point $P_{11}$.

The position of the control point $P_{31}$ following the control point $P_{21}$ is defined by a displacement L3 in the horizontal direction and a displacement $\delta_{31}$ in the vertical direction, as viewed from the control point $P_{21}$. In this manner, the positions of the control points $P_{41}$ and $P_{51}$ are sequentially defined each by a displacement in the horizontal direction and a displacement in the vertical direction as viewed from the preceding control point.

The position of the vertex (control point) $P_{02}$ at the upper end of the end side ES1 is defined by the coordinates of the figure placement origin $P_{01}$ and a length L0 of the end side ES1 extending perpendicularly from the figure placement origin $P_{01}$.

Of the control points for the curve C2, the control point $P_{12}$ follows (or is next to) the control point $P_{02}$. The position of the control point $P_{12}$ is defined by the displacement L1 in the curve's traveling direction (horizontal direction) and a displacement $\delta_{12}$ in the vertical direction, as viewed from the control point $P_{02}$.

The position of the control point $P_{22}$ following the control point $P_{12}$ is defined by the displacement L2 in the horizontal direction and a displacement $\delta_{22}$ in the vertical direction, as viewed from the control point $P_{12}$. In this manner, the positions of the control points $P_{32}$, $P_{42}$, and $P_{52}$ are sequentially defined each by a displacement in the horizontal direction and a displacement in the vertical direction as viewed from the preceding control point.

As described above, the shape of a figure with curves can be defined by the coordinates (x0, y0) of the figure placement origin $P_{01}$, the length L0 of the end side ES1, the displacements L1 to L5 of the adjacent control points in the curve's traveling direction (horizontal direction), and the displacements $\delta_{11}$, $\delta_{12}$, $\delta_{21}$, $\delta_{22}$, $\delta_{31}$, $\delta_{32}$, $\delta_{41}$, $\delta_{42}$, $\delta_{51}$ and $\delta_{52}$ in the direction (vertical direction) orthogonal to the curve's traveling direction, as viewed from the adjacent control points. Note that the displacements $\delta_{11}$, $\delta_{12}$, $\delta_{21}$, $\delta_{22}$, $\delta_{31}$, $\delta_{32}$, $\delta_{41}$, $\delta_{42}$, $\delta_{51}$ and $\delta_{52}$ are signed values.

Figures 3, 4:
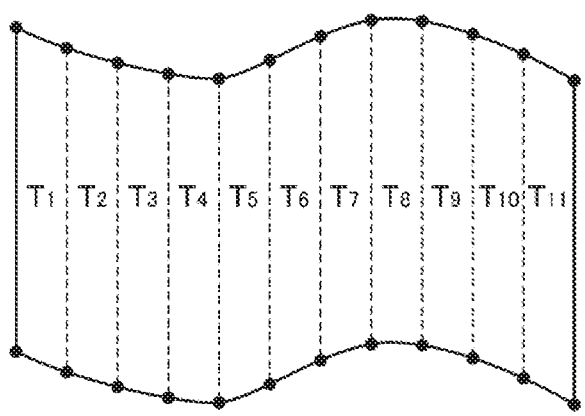
FIG. 3 is a diagram illustrating an exemplary data structure of writing data.
FIG. 4 is a diagram illustrating a figure dividing process according to a comparative example.

FIG. 3 illustrates an exemplary data structure of the writing data D1 that defines a figure with curves. The writing data D1 includes a header and a body containing shape information. The header defines a figure code (Code), the number of elements (N), and curve information.

The figure code is information indicating the type of a figure defined. For a figure with curves, information indicating "curve" is defined as the figure code.

The number of elements indicates the number of control points whose positions are defined each by a displacement from the preceding control point. In the example illustrated in FIG. 2, the number of elements is five.

The curve information defines parameters, such as a curve type, order, knot vector information, and end-point information, for determining a parametric curve. Examples of the curve type include a B-spline curve and a Bezier curve. In the example illustrated in FIG. 2, the curve type is "B-spline curve", the order is "cubic (or third order)", the knot vector information is "uniform", and the end-point information is "clamp".

As the shape information in the body, the coordinates (x0, y0) of the figure placement origin and the length L0 of the end side ES1 are first defined. This information determines the positions of the upper and lower vertices (control points) of the end side ES1. Next, the displacements L1, $\delta_{11}$, and $\delta_{12}$ for determining the positions of the second control points $P_{11}$ and $P_{12}$ for the curves C1 and C2 are defined. In this manner, the displacements in the horizontal and vertical directions for determining the positions of the control points for the curves C1 and C2 are sequentially defined.

Comparative Example

Writing data can be generated by approximating a figure with curves to a polygonal figure and dividing the polygonal figure into a plurality of trapezoids. For example, as illustrated in FIG. 4, the figure with curves illustrated in FIG. 2 can be approximated to a plurality of narrow trapezoids T1 to T11 coupled in the horizontal direction. In the writing data, the position of each vertex is defined by a displacement in the vertical direction and a displacement in the horizontal direction, as viewed from the adjacent vertex.

As illustrated in FIG. 4, the figure with curves is divided into eleven trapezoids T1 to T11 to approximate the curves. The upper and lower sides each have eleven vertices whose positions are defined each by a displacement in the vertical direction and a displacement in the horizontal direction, as viewed from the adjacent vertex.

In the present embodiment, on the other hand, the curve portions of the figure are each represented by a parametric curve using a plurality of control points. The control points are fewer than the vertices determined by division into trapezoids in the comparative example.

For example, in the example illustrated in FIG. 2, the curves C1 and C2 (upper and lower sides) each have five control points whose positions are defined each by a displacement in the vertical direction and a displacement in the horizontal direction, as viewed from the adjacent control point.

Thus, by expressing the curve portions of the figure through parametric curve representation using a plurality of control points, the amount of the writing data D1 can be reduced.

The control computer 52 reads the writing data D1 and reconstructs the figure. For example, from the coordinates (x0, y0) in the writing data D1, the control computer 52 calculates the position of the control point $P_{01}$ serving as the figure placement origin. Next, the control computer 52 calculates the position of the control point $P_{02}$ at the upper end of the end side ES1 using the length L0.

The control computer 52 then calculates the positions of the control points $P_{11}$ and $P_{12}$ using the calculated positions of the control points $P_{01}$ and $P_{02}$ and the displacements L1, $\delta_{11}$, and $\delta_{12}$ defined in the writing data D1. In this manner, the control computer 52 sequentially calculates the positions of the adjacent control points. After calculating the positions of all the control points on the basis of the number of elements N, the control computer 52 refers to the curve information and calculates the curves C1 and C2. The figure with curves is thus reconstructed.

As described above, the writing data D1 that expresses the curve portions of the figure through parametric curve representation can be easily processed within the control computer 52 of the writing apparatus 1, and this reduces the amount of calculation.

In the embodiment described above, information about allowable error between a curve generated by a plurality of control points and a curve portion of the figure with curves included in the design data D0 may be added to the writing data D1.

Although the curve's traveling direction is horizontal in the embodiment described above, the definition described above is applicable even when it is vertical. The header of the writing data D1 can define whether the curve's traveling direction is vertical or horizontal.

Figure 5:
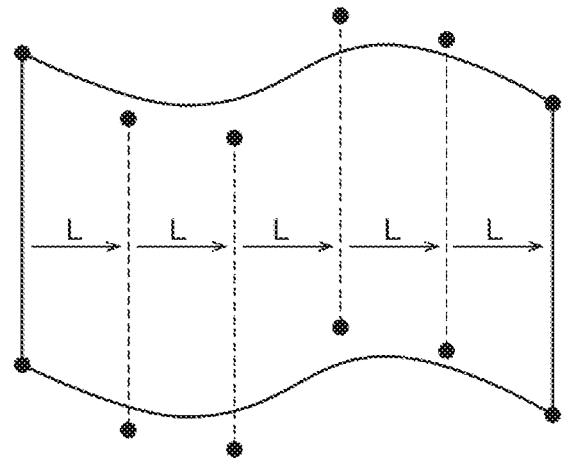
FIG. 5 is a diagram illustrating an exemplary representation of a curve according to another embodiment.

In the embodiment described above, the distances (or displacements) between adjacent control points in the curve's traveling direction (horizontal direction in the example illustrated in FIG. 2) may be any values. Alternatively, as illustrated in FIG. 5, the control points may be located at regular intervals. This can further reduce the amount of the writing data D1.

Figure 6:
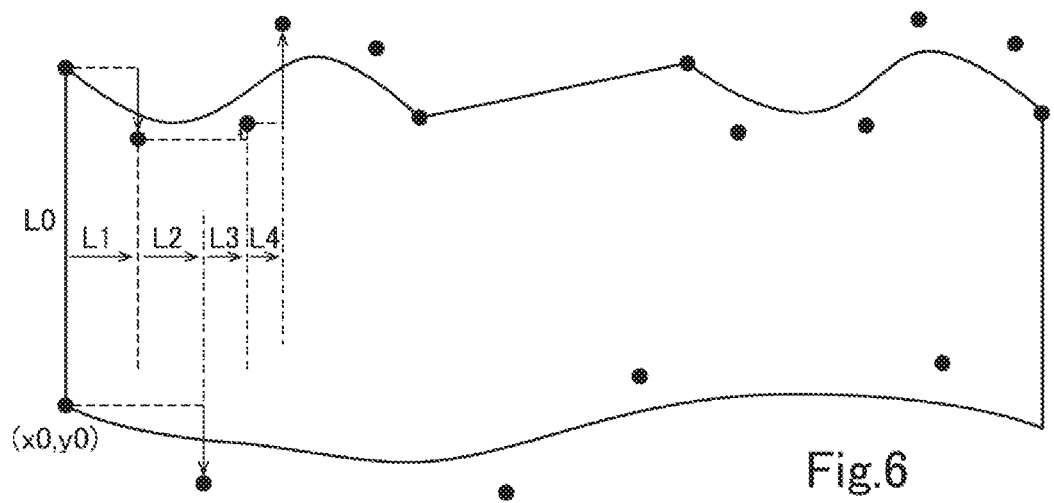
FIG. 6 is a diagram illustrating an exemplary representation of a curve according to another embodiment.
Figure 7:
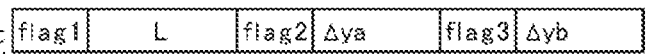
FIG. 7 is a diagram illustrating an exemplary data structure of writing data.

Although the corresponding upper and lower control points have the same horizontal position in the embodiment described above, they may not be aligned as illustrated in FIG. 6. The upper side portion and the lower side portion may differ in the number of control points. The upper side portion and the lower side portion may include straight lines and right-angle portions, as well as curves. The data structure of the writing data D1 in this case is illustrated in FIG. 7.

As the curve information in the header, "mixed-side type" and "non-aligned control point type" are defined. The "mixed-side type" indicates that multiple types of sides, such as curves, straight lines, and right-angles, are included. The "non-aligned control point type" indicates that upper and lower control points have different horizontal positions and are not aligned.

Point information (EP1 to EPn) is defined when at least one of the upper and lower side portions has a point (control point or vertex). The point information includes flag1, L, flag2, Δya, flag3, and Δyb. The "L" is defined as a displacement in the horizontal direction as viewed from the preceding point information.

Figure 8B:
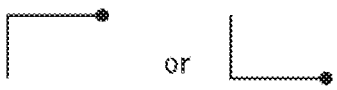
FIGS. 8b and 8c are diagrams illustrating a right angle type.
Figure 8C:
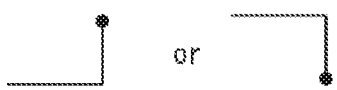

The "flag2" and "Δya" are defined when the lower side portion has a point. The "Δya" indicates a displacement in the vertical direction as viewed from the preceding point for the lower side portion. The "flag2" represents a 2-bit value indicating the type of a side between the current point and the preceding point, and has one of the meanings shown in FIG. 8a. That is, the value "00" of flag2 indicates a right angle of type I shown in FIG. 8b, and the value "01" of flag2 indicates a right angle of type II shown in FIG. 8c. The value "10" of flag2 indicates a straight line, and the value "11" of flag2 indicates a curve.

The "flag3" and "Δyb" are defined when the upper side portion has a point. The "Δyb" indicates a displacement in the vertical direction as viewed from the preceding point for the upper side portion. The "flag3" represents a 2-bit value indicating the type of a side between the current point and the preceding point, and has one of the meanings shown in FIG. 8a.

Figures 8A, 9, 10:
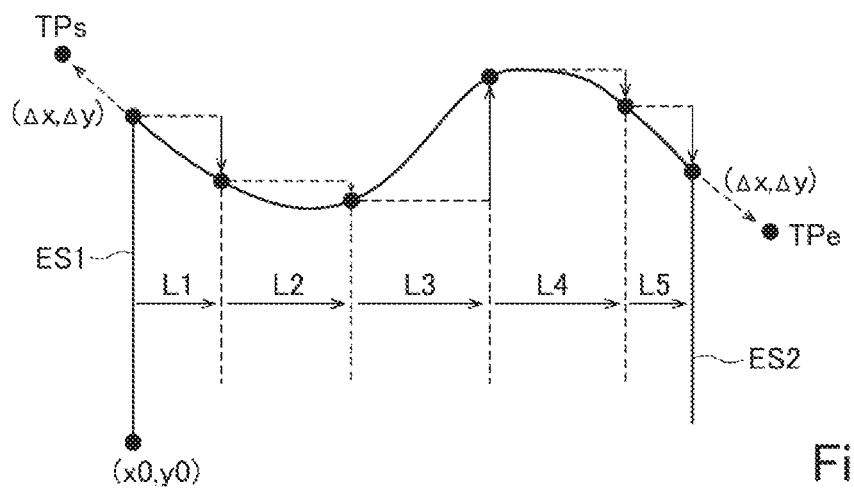
FIG. 8a is a table illustrating meaning of flags.
FIG. 9 is a table illustrating meaning of flags.
FIG. 10 is a diagram illustrating an exemplary representation of a curve according to another embodiment.

The "flag1" represents a 2-bit value indicating whether the point information includes information about a point for the lower side portion or the upper side portion, and has one of the meanings shown in FIG. 9. That is, when the value of flag1 is "01", the point information includes information about a point for the lower side portion (flag2 and Δya) and does not include information about a point for the upper side portion (flag3 and Δyb).

When the value of flag1 is "10", the point information does not include information about a point for the lower side portion (flag2 and Δya) and includes information about a point for the upper side portion (flag3 and Δyb). When the value of flag1 is "11", the point information includes information about both a point for the lower side portion (flag2 and Δya) and a point for the upper side portion (flag3 and Δyb).

When the value of flag1 is "00", the point information includes information about neither a point for the lower side portion (flag2 and Δya) nor a point for the upper side portion (flag3 and Δyb); that is, the value "00" of flag1 indicates a flat portion with no displacement in the vertical direction.

With this data structure, the writing data D1 can achieve a greater degree of freedom in representing the shapes of figures.

In the embodiment described above, a plurality of control points are set between the end side ES1 and the end side ES2 to approximate a curve portion of the figure. Alternatively, as illustrated in FIG. 10, control points TPs and TPe may be set outside the end sides ES1 and ES2, respectively, in the right-left direction. In this case, "Catmull-Rom spline curve" is defined as the curve type in the curve information, and "non-clamp" is defined as the end-point information in the curve information.

The positions of the control points TPs and TPe located at both ends in the curve's traveling direction are each represented by displacements (Δx, Δy) from the adjacent control point and defined in the body. This enables selection of curve representation whose end points do not coincide with the respective end points of a curve portion of the figure.

Figure 11:
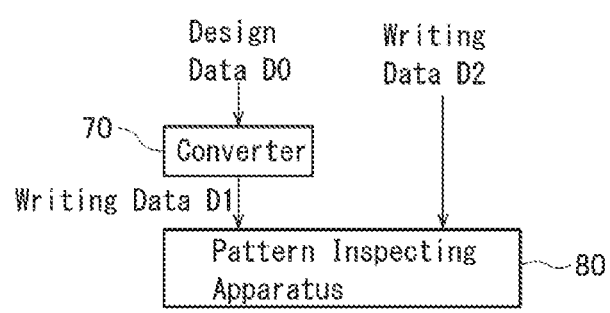
FIG. 11 is a schematic block diagram of a pattern inspecting apparatus.

The writing data D1 generated by the converter 70 according to the embodiment may be input to a pattern inspecting apparatus. For example, as illustrated in FIG. 11, the writing data D1 (first writing data) generated by the converter 70 and writing data D2 (second writing data) are input to a pattern inspecting apparatus 80. The writing data D2 is generated on the basis of a pattern actually written on a writing target substrate by the writing apparatus 1 illustrated in FIG. 1 on the basis of the writing data D1. The writing data D2 is input to the pattern inspecting apparatus 80 from a storage device (not shown) through a wired or wireless network.

On the basis of the writing data D1 and D2 received, the pattern inspecting apparatus 80 inspects the pattern actually written on the writing target substrate by the writing apparatus 1. The inspection involves, for example, comparing the writing data D1 and the writing data D2. Various types of other information, such as writing conditions, are also used in the inspection.

The writing data D1 generated by the converter 70 is small in size and can be readily processed. This improves processing efficiency of the pattern inspecting apparatus 80.

The converter 70 may be included in the pattern inspecting apparatus 80. In this case, the pattern inspecting apparatus 80 includes a converting unit that generates the writing data D1 on the basis of the design data D0 input thereto, and an inspecting unit that compares the writing data D1 and the writing data D2 to inspect a pattern actually written on the writing target substrate.

Generation of the writing data D1 according to the embodiment described above may be performed in the control computer 52 of the writing apparatus 1. Upon receiving the design data D0, the control computer 52 selects curve representation used to approximate a curve portion of the figure, calculates a plurality of control points, and expresses the position of each of the control points as a displacement from the position of the adjacent control point to generate the writing data D1.

At least part of the converter 70 for generating the writing data D1 described in the above embodiments may be implemented in either hardware or software. When implemented in software, a program that realizes at least part of functions of the converter 70 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the converter 70 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Although the present invention has been described in detail with respect to some specific embodiments, the skilled person will appreciate that various modifications are possible within the spirit and scope of the invention.

This application is based upon Japanese Patent Application No. 2017-180067 filed on Sep. 20, 2017, the entire contents of which are incorporated herein by reference.

EXPLANATION OF REFERENCES 1 writing apparatus
10 writer
12 electron beam column
14 electron gun
16 illuminating lens
18 aperture member
20 blanking plate
22 reducing lens
24 limiting aperture member
26 objective lens
28 deflector
30 writing chamber
32 XY stage
34 mask blank
36 mirror
50 controller
52 control computer
54, 56 deflection control circuit
58 stage position detector
70 converter
80 pattern inspecting apparatus

The invention claimed is:

1. A multi charged particle beam writing method comprising:
    calculating a curve representing a curve portion of a figure included in design data, the curve being defined by a plurality of control points, having a predetermined traveling direction, and not bending 90° or more from the traveling direction,
    calculating a line representing the figure and paired with the curve, the line being defined by a plurality of control points, having a predetermined traveling direction, and not bending 90° or more from the traveling direction;
    generating writing data by expressing a position of a second control point adjacent in the traveling direction of the curve to a first control point of the plurality of control points for the curve as a displacement from the first control point in the traveling direction of the curve and a displacement from the first control point in a direction orthogonal to the traveling direction of the curve, and expressing a position of a fourth control point adjacent in the traveling direction of the line to a third control point of the plurality of control points for the line as a displacement from the third control point in the traveling direction of the line and a displacement from the third control point in a direction orthogonal to the traveling direction of the line; and
    controlling a multi charged particle beam writing apparatus using the writing data to write a pattern by irradiating a substrate with a multi charged particle beam.

2. The method according to claim 1, wherein the figure includes a pair of a first curve and a second curve; and
    a plurality of control points defining the first curve each have the same coordinate in the traveling direction as a corresponding one of a plurality of control points defining the second curve.

3. The method according to claim 2, wherein the plurality of control points are located at regular intervals in the traveling direction.

4. The method according to claim 1, wherein the figure includes a pair of a first curve and a second curve; and
    at least some of a plurality of control points defining the first curve differ in coordinate in the traveling direction from a plurality of control points defining the second curve.

5. The method according to claim 4, wherein the number of the control points defining the first curve and the number of the control points defining the second curve are different.

6. The method according to claim 1, wherein of the plurality of control points, control points at both ends in the traveling direction do not coincide with respective end points of the curve portion of the figure.

7. The method according to claim 6, wherein the control points at both ends are located outside the respective end points of the curve portion of the figure in the traveling direction.

8. A non-transitory computer-readable recording medium recording a program causing a computer to execute:
calculating a curve representing a curve portion of a figure included in design data, the curve being defined by a plurality of control points, having a predetermined traveling direction, and not bending 90° or more from the traveling direction; and
calculating a line representing the figure and paired with the curve, the line being defined by a plurality of control points, having a predetermined traveling direction, and not bending 90° or more from the traveling direction;
generating writing data by expressing a position of a second control point adjacent in the traveling direction of the curve to a first control point of the plurality of control points for the curve as a displacement from the first control point in the traveling direction of the curve and a displacement from the first control point in a direction orthogonal to the traveling direction of the curve, and expressing a position of a fourth control point adjacent in the traveling direction of the line to a third control point of the plurality of control points for the line as a displacement from the third control point in the traveling direction of the line and a displacement from the third control point in a direction orthogonal to the traveling direction of the line; and
controlling a multi charged particle beam writing apparatus using the writing data to write a pattern by irradiating a substrate with a multi charged particle beam.

9. A multi charged particle beam writing apparatus comprising:
a writer forming multiple beams composed of a plurality of charged particle beams, individually turning on and off corresponding beams of the multiple beams, and irradiating a target object with charged particle beams to write a pattern onto the target object; and
a controller calculating a curve representing a curve portion of a figure included in design data, the curves curve defined by a plurality of control points, having a predetermined traveling direction, and not bending 90° or more from the traveling direction, calculating a line representing the figure and paired with the curve, the line being defined by a plurality of control points, having a predetermined traveling direction, and not bending 90° or more from the traveling direction, generating writing data by expressing a position of a second control point adjacent in the traveling direction of the curve to a first control point of the plurality of control points for the curve as a displacement from the first control point in the traveling direction of the curve and a displacement from the first control point in a direction orthogonal to the traveling direction of the curve, and expressing a position of a fourth control point adjacent in the traveling direction of the line to a third control point of the plurality of control points for the line as a displacement from the third control point in the traveling direction of the line and a displacement from the third control point in a direction orthogonal to the traveling direction of the line, and controlling the writer based on the writing data.

10. A pattern inspecting apparatus comprising:
a converter calculating a curve representing a curve portion of a figure included in design data, the curve being defined by a plurality of control points, having a predetermined traveling direction, and not bending 90° or more from the traveling direction, calculating a line representing the figure and paired with the curve, the line being defined by a plurality of control points, having a predetermined traveling direction, and not bending 90° or more from the traveling direction, and generating first writing data by expressing a position of a second control point adjacent in the traveling direction of the curve to a first control point of the plurality of control points for the curve as a displacement from the first control point in the traveling direction of the curve and a displacement from the first control point in a direction orthogonal to the traveling direction of the curve, and expressing a position of a fourth control point adjacent in the traveling direction of the line to a third control point of the plurality of control points for the line as a displacement from the third control point in the traveling direction of the line and a displacement from the third control point in a direction orthogonal to the traveling direction of the line; and
an inspector inspecting a pattern by comparing the first writing data and second writing data generated based on the pattern, the pattern being written onto a target object by irradiating the target object with charged particle beams.

* * * * *